United States Patent [19]

Schwee

[11] Patent Number: 5,038,323

[45] Date of Patent: Aug. 6, 1991

[54] NON-VOLATILE MEMORY CELL WITH FERROELECTRIC CAPACITOR HAVING LOGICALLY INACTIVE ELECTRODE

[75] Inventor: Leonard J. Schwee, Silver Spring, Md.

[73] Assignee: The United States of America as represented by the Secretary of the Navy, Washington, D.C.

[21] Appl. No.: 489,138

[22] Filed: Mar. 6, 1990

[51] Int. Cl.⁵ .............................................. G11C 13/00
[52] U.S. Cl. .................................. 365/145; 365/189.01
[58] Field of Search ............................ 365/145, 189.01

[56] References Cited

U.S. PATENT DOCUMENTS

| | | | |
|---|---|---|---|
| 2,900,622 | 8/1959 | Rajchman | 365/145 |
| 3,158,842 | 11/1964 | Anderson | 365/145 |
| 3,401,378 | 9/1968 | Bartlett et al. | 365/145 |
| 4,873,664 | 10/1989 | Eaton, Jr. | 365/149 |
| 4,893,272 | 1/1990 | Eaton, Jr. et al. | 365/189.06 |

Primary Examiner—Terrell W. Fears
Attorney, Agent, or Firm—Kenneth E. Walden; Jacob Shuster

[57] ABSTRACT

The ferroelectric capacitor in each memory cell of an array has a logically inactive electrode plate maintained at a fixed voltage level and an opposed electrode plate coupled through a switching transistor, turned on by address signals, to a bit line through which the polarization of the capacitor is logically controlled to write and store binary logic data therein which is also readout through the same bit line at a different time during a logic restoring read operation. The ferroelectric material has sufficient conductivity to maintain the electrodes at nearly equal potentials.

20 Claims, 2 Drawing Sheets

NON-VOLATILE MEMORY CELL WITH FERROELECTRIC CAPACITOR HAVING LOGICALLY INACTIVE ELECTRODE

BACKGROUND OF THE INVENTION

This invention relates to improvements in non-volatile, self restoring memories as referred to and disclosed in my prior copending application, Ser. No. 54,973, filed May 5, 1987, with respect to which the present application is a continuation-in-part.

According to the disclosure in my aforementioned prior copending application, which is incorporated herein by reference, the top electrode plate of the capacitor in each of the cells of a ferroelectric memory array was logically active in controlling capacitor polarization by a controlled supply of high and low voltages thereto. The logic drive circuitry necessary to control the supply of such different voltages to the top electrode plates of the capacitors in the memory cells, renders the associated memory array somewhat costly to manufacture and dimensionally extensive. Further, the voltage plate lines associated with such logic drive circuitry may be a troublesome source of disturbances.

It is therefore an important object of the present invention to provide a memory array of the foregoing type which is capable of being fabricated with greater facility and higher density by solid state chip manufacturing techniques.

A further object in accordance with the foregoing object is to provide a ferroelectric memory array that is less prone to disturbances.

SUMMARY OF THE INVENTION

In accordance with the present invention, one of the electrode plates of the storage capacitors in the cells of a ferroelectric memory array are maintained logically inactive at a substantially constant or fixed voltage level of approximately one-half the supply voltage. The opposed electrode plates of the capacitors are connected to pass-gate or switching transistors in the memory cells through which electrical connections to the bit lines are established during write or read operations in response to address turn-on signals applied to the transistors through the word lines of the memory array. The polarization state of each of the capacitors is controlled exclusively through the electrode plate thereof connected to the switching transistor for storing binary logic data in the capacitor. Accordingly, logic voltages on the bit lines are transferred at the beginning of write operations through the switching transistors to the exclusive logically active electrode plates of the capacitors. The bit lines are otherwise held low or near ground between the write or read operations. Such logic data transfer operations are made possible in a trouble-free manner through logic control circuit generally known in the art interrelated operational parameters of the storage capacitors and switching transistors in dependence on the capacitive shunting resistance attributed to the ferroelectric material associated with the logic data storing capacitors. Restoration of stored logic data is effected by reversal in polarization of the capacitors, if necessary, in response to detection of bit line voltage levels by sense amplifiers through the logic control circuitry, the details and specific parameters of which form no part of the present invention.

BRIEF DESCRIPTION OF DRAWING FIGURES

Other objects, advantages and novel features of the invention will become apparent from the following detailed description of the invention when considered in conjunction with the accompanying drawing wherein.

DETAILED DESCRIPTION OF PREFERRED EMBODIMENT

Figure 1:
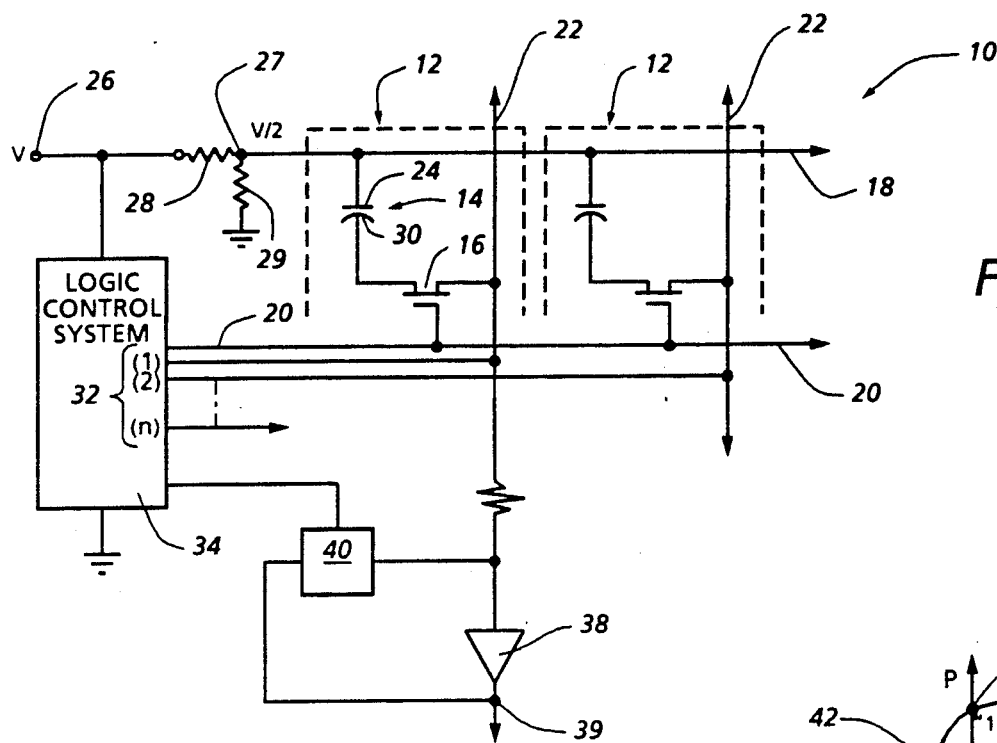
FIG. 1 is a circuit diagram of a portion of a memory array arranged in accordance with one embodiment of the present invention.

Referring now to the drawing in detail, FIG. 1 illustrates a portion of a non-volatile random access memory array, generally referred to by reference numeral 10. The memory array is formed by a plurality of memory cells 12, each cell consisting of a ferroelectric capacitor 14 and a switching device in the form of a field effect transistor 16 of the n channel enhancement mode type (MOSFET) according to one embodiment of the invention.

All of the memory cells of the array are connected to a common voltage plate line 18 distinct from a word line 20 connected to each row of horizontally aligned cells and a bit line 22 connected to each column of vertically aligned cells. A predetermined number of such data bit lines 22 are provided for readout of a byte when addressed through one of the word lines 20, operatively connected through selected memory cells 12 as known and understood by persons skilled in the art.

In accordance with the present invention, the top electrode plates 24 of the ferroelectric capacitors 14 in each of the memory cells 12 have a fixed voltage of approximately one-half the supply voltage supplied thereto and maintained thereon from a voltage source 26 through the plate line 18 by any suitable means such as voltage divider resistor 28 and grounded resistor 29 connected to line 18 at voltage supply terminal 27 as diagrammed in FIG. 1. The top electrode plate 24 of the ferroelectric capacitor in each memory cell 12 is accordingly inactive, from a logic control standpoint, as compared to the opposed bottom electrode plate 30 from which a source/drain conductive path to a corresponding bit line 22 is established by turn-on of the switching transistor 16 in response to an address select signal applied to its control gate electrode through a corresponding word line 20. When the transistors 16 are non-conductive or turned off between write/read operations to isolate the capacitors 14 from their bit lines 22, the bottom plates 30 are electrically disconnected from their bit lines which are then maintained near ground. A low voltage near ground is established on the bit lines through control lines $32_{(1)}, 32_{(2)}, \ldots 32_{(n)}$ extending from a logic control system 34, as diagrammed in FIG. 1, to which the address select line 20 is connected.

As also diagrammed in FIG. 1, the logic voltage level of each bit line 22 is detected through a sense amplifier 38 from which data readout is obtained at readout terminal 39. A logic gate 40 operated by the logic control system 34 is interconnected between the output of the sense amplifier and the logic controlled portion of the bit line for restoration of the polarization state of the capacitor 14 prior to completion of each read operation.

Figure 2:
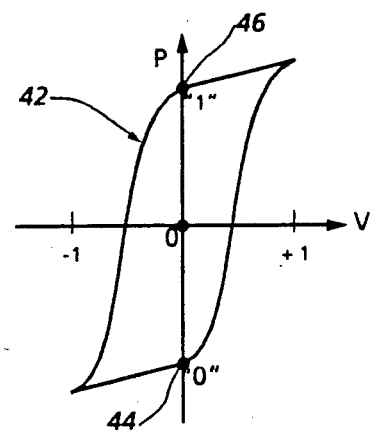
FIG. 2 is a graphical illustration of the polarization hysteresis curve associated with the ferroelectric capacitors in the memory cells of the array diagrammed in FIG. 1.

The polarization states of each of the ferroelectric capacitors 14 is characterized by a typical hysteresis curve 42 graphically plotted with respect to field voltage and polarization in FIG. 2. Point 44 on curve 42 represents the negative polarization state of capacitor 14 during storage of logic zero wherein very little charging of its bit line 22 occurs during a read operation so that the bit line remains near ground. A logic "one" at point 46 represents, on the other hand, a distinctly different positive polarization state of the capacitor 14 wherein it will dump its charge onto its bit line during a discharge period greater than the duration of charge transfer while electrically connected to the bit line by its switching transistor 16. The capacitor 14 is restored to its logic "one" state through gate 40 after such dumping of the capacitor charge in response to detection of the ensuing increase in the voltage level on its bit line 22 by the sense amplifier 38 during readout of logic "one" data.

Figure 3:
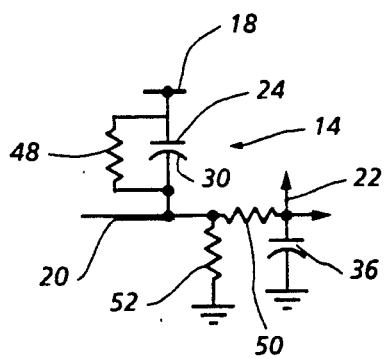
FIG. 3 is an equivalent circuit diagram corresponding to each of the memory cells diagrammed in FIG. 1.

For operation of each cell 12 of the memory array 10 in accordance with the present invention, the ferroelectric material for the capacitor 14 is chosen to provide conductivity characterized by an equivalent shunting resistance 48, sufficient to maintain a voltage on the bottom plate 30 close to half the supply voltage of 2.5 volts, for example, by virtue of an equivalent circuit as diagrammed in FIG. 3. The equivalent resistance 48 across each capacitor 14 is however smaller than the value of the equivalent resistance 50, exhibited by transistor 16 in its non-conductive state, as diagrammed in FIG. 3 which also shows a grounded parasitic resistance 52 associated with the transistor 16 and a parasitic grounded capacitance 36 for the bit line 22. The electrode plates 24 and 30 are thereby maintained at nearly equal potentials.

Figure 4:
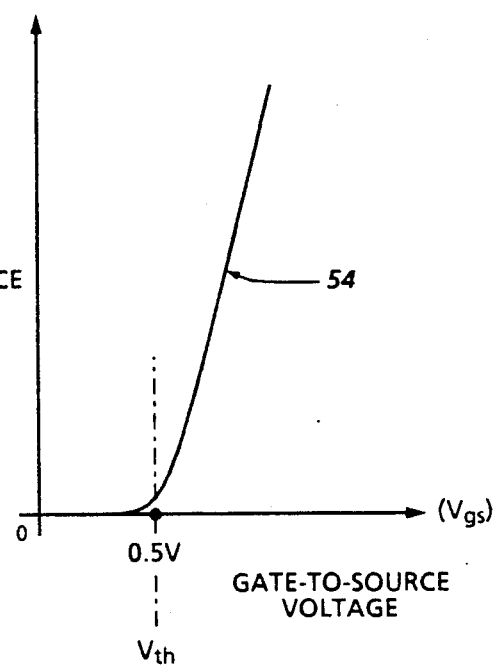
FIG. 4 is a graph depicting characteristics of the switching transistor associated with each memory cell diagrammed in FIGS. 1 and 3.

FIG. 4 shows a typical curve 54 characterizing variation of the gate-to-source voltage (Vgs) of the transistor 16 as a function of its drain to source conductance (I/R). As denoted in FIG. 4, a threshold voltage (Vth) of 0.5 volts for example when established by address through the word line 20, causes a sharp rise in conductance of the transistor for turn-on thereof. Based on the foregoing characteristic of a transistor 16 of the MOS-FET type as aforementioned, equivalent drain/source resistances 50 will be exhibited having an off/on ohmic ratio of $5 \times 10^8$. With the conductivity of the ferroelectric material associated with capacitor 14 corresponding to resistance value of $10^8$ ohms for equivalent resistance 48 as diagrammed in FIG. 3, a very low leakage to ground of about $10^{-11}$ amperes through the resistance 52 at transistor 16 will occur in its turn-off state while top electrode plate 24 is maintained at a constant supply voltage of 2.5 volts. In such off state of transistor 16, the off value of resistance 50 will be $5 \times 10^{12}$ ohms to substantially maintain the bottom plate 30 of capacitor 14 at the 2.5 volt level of the top plate 24. When the transistor 16 is switched on by a high voltage address applied to word line 20, resistance 50 of transistor 16 is reduced to $10^4$ ohms in order to write a logic "one" from a bit line at a high level of approximately 4 volts for example.

Such action of transistor 16 in connection with write of a logic "one" has a duration of approximately 20 nanoseconds. When the bit line 22 is low at approximately 1 volt for example, in connection with a write action for a logic zero, the lower switch on resistance value for the resistance 50 in the equivalent circuit of FIG. 3 and the duration of such logic zero write action are the same as in the case of the write action for logic "one". Once the transistor 16 is turned off, the bottom electrode plate 30 returns to the 2.5 volt level of the top electrode 24 while the resistance 50 returns to its higher value.

During a read operation, the value of the parasitic capacitance 36 for each bit line is dependent on the number of rows associated therewith, while the value of resistance 50 of the equivalent circuit of FIG. 3 is reduced as hereinbefore described with respect to the logic write actions. The duration of the read action is also the same as that of the logic write actions as the lower plate 30 of capacitor 14 rapidly drops to the potential of the bit line on the non-grounded side of the equivalent parasitic capacitance 36 diagrammed in FIG. 3. The value of capacitance 36 is large enough compared to that of ferroelectric capacitor 14 so that a very small voltage change across the parasitic capacitance 36 occurs during the short duration of the read action of approximately 20 nanoseconds. Thus, if a logic zero is stored in capacitor 14, very little charge is dumped onto the parasitic capacitor 36. If a logic "one" is stored, then the capacitor 14 will dump or transfer a charge of about $2 \times 10^{-13}$ coulombs to apply a 0.1 volt detectable signal to the sense amplifier 38.

Figure 5:
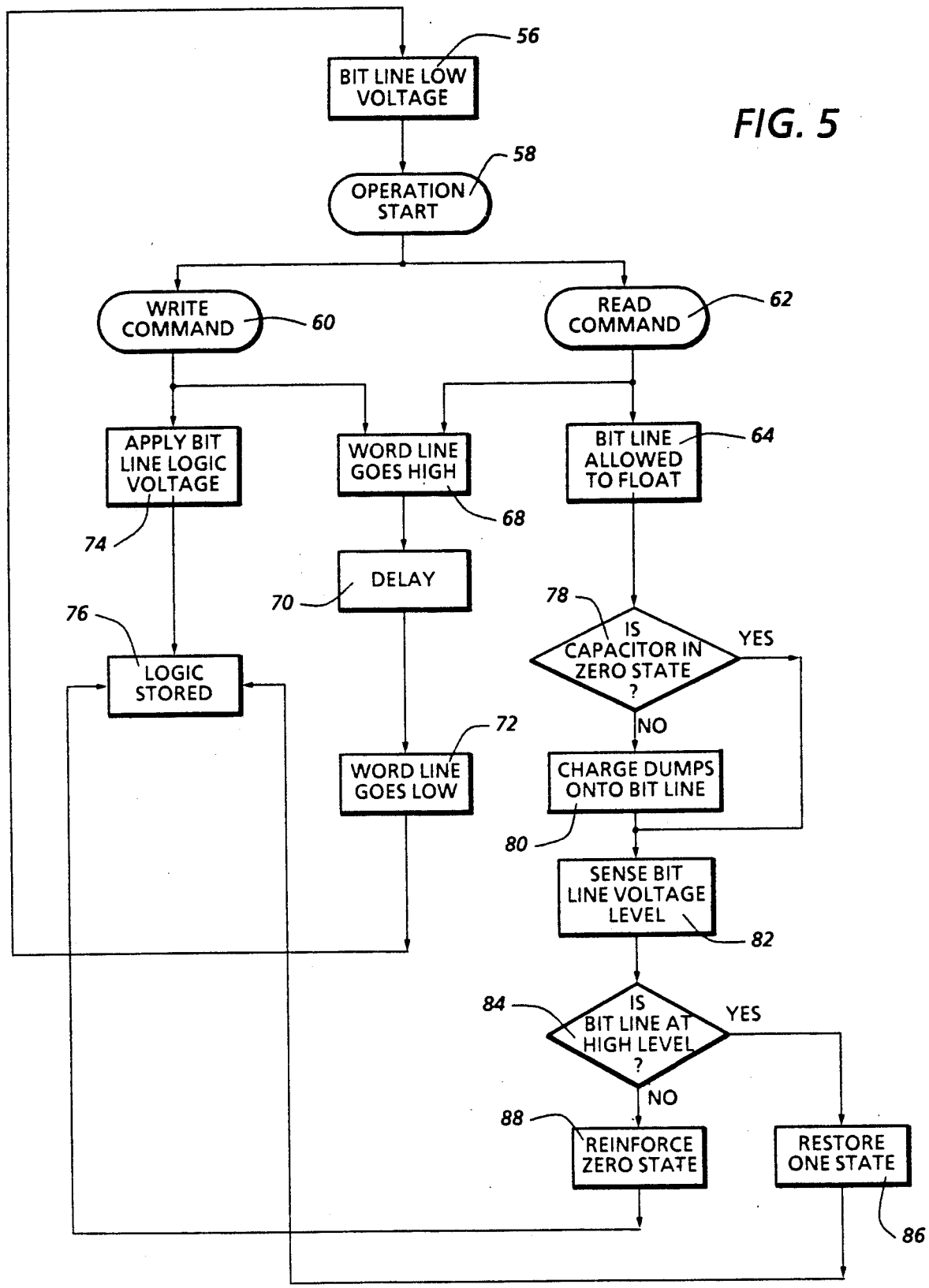
FIG. 5 is a program flow chart diagramming the logic controlled operations associated with the memory array of FIG. 1.

The program flow chart of FIG. 5 diagrams operation of the memory array 10 under control of the logic control system 34 with respect to each memory cell 12 as hereinbefore described. As denoted by diagram block 56 in FIG. 5, the bit line 22 is held near ground before operation start 58 initiates either a write command 60 or a read command 62. When either logic action started by the write or read command 60 or 62 is terminated, the bit line is again held low near ground as diagrammed in FIG. 5.

The write action initiated in response to command 60 allows an addressed word line 20 to go high as denoted at 68 in FIG. 5 to turn on the transistor 16 for a change transfer phase of operation. When transfer of the capacitor charge is completed upon elapse of delay 70, the word line 20 goes low as denoted at block 72 to terminate the logic operation.

With start of the write action, the bit lines 22 are either raised to the high logic level through the control lines 32 or kept at low logic levels as denoted by block 74. Thus during the charge transfer phase of operation, a high voltage on bit line 22 is transferred to the bottom plate 30 of capacitor 14 to either reinforce or reverse its previous polarization state. Accordingly, a low bit line voltage level will store a zero logic state in capacitor 14 while a high bit line voltage level will store a logic "one" state in capacitor 14 to effect the logic store phase denoted at 76 before the write action is terminated.

A read action initiated by command 62, is followed by the bit line being allowed to float before the charge transfer phase begins as denoted by block 64. If the prior logic state of capacitor 14 is zero as determined at decision block 78 in FIG. 5, the bit line remains low. Otherwise, the capacitor 14 dumps its charge onto the bit line as indicated at 80. When such charge transfer phase is almost completed, the voltage level on the bit line is detected as denoted at 82 to determine whether it is at the high level as indicated at decision block 84. If the detected voltage level of the bit line is higher than the threshold level, the charged logic one condition of the capacitor 14 being read is restored, as indicated at block 86, to its previous written logic one state and a high voltage is applied to output pin 39 as shown in FIG. 1. If the detected voltage level of the bit line is low, the previous logic zero state of capacitor 14 being read is reinforced as denoted at 88 in FIG. 5. Such data read phase is completed when the word line 20 goes low, as indicated at 72, terminating the read action.

Although a value of $10^8$ ohms was assigned to the shunt resistance 48 for the ferroelectric capacitor 14 in the example hereinbefore given, a value of $10^6$ could also be assigned. Given the other values of resistances 50 and 52, a range of shunt resistance values from $10^6$ to $10^8$ ohms are acceptable for good operation.

Numerous other modifications and variations of the present invention are possible in light of the foregoing teachings. It is therefore to be understood that within the scope of the appended claims the invention may be practiced otherwise than as specifically described.

What is claimed is:

1. In a non-volatile memory array including a source of voltage and a bit line having a parasitic capacitive reactance, a ferroelectric memory cell comprising a capacitor having opposed electrode plates, means connecting the source to one of the electrode plates of the capacitor for applying a constant voltage thereto under two distinct hysteresis states, switching means interconnected between the other of the electrode plates of the capacitor and the bit line for transfer of charge to the bit line during read operations by discharge of the capacitor, means connected to the switching means for isolating the bit line from the capacitor between said read operations, sense means connected to the bit line for detecting changes in voltage level therein during said read operations and means for restoring the capacitor to one of two hysteresis states thereof in response to one of the detected changes in the voltage level.

2. The combination of claim 1 wherein said switching means is a transistor having a control electrode connected to the logic controlled means.

3. The combination of the claim 2 wherein said sense means includes means for amplifying said changes in the voltage level, and said restoring means includes logic gate means connected to the amplifying means for applying an amplified output thereof to the capacitor through the transistor upon completion of the read operations.

4. The combination of claim 1 wherein said sense means includes means for amplifying said changes in the voltage level, and said restoring means includes switch means connected to the amplifying means for applying an amplified output thereof to the capacitor through the switching means upon completion of the read operations.

5. The combination of claim 1 wherein said capacitor conducts current through an equivalent resistive shunt path smaller in resistance than that of the switching means in a non-conductive state to isolate the capacitor from the bit line between said read operations.

6. The combination of claim 5 wherein said parasitic capacitive reactance of the bit line is substantially higher than that of the capacitor.

7. In combination with a random access memory having a source of voltage, a bit line, a capacitor, means connected to the voltage source for applying and maintaining a fixed voltage on the capacitor and switching means operatively connected between the capacitor and the bit line for isolation of the capacitor from the bit line between writing and readout operations, said capacitor consisting of ferroelectric means for storing logic data therein dependent on two hysteresis states thereof, address means for selectively rendering the switching means operative only during said writing and readout operations to transfer non-zero charge to the bit line and sensing means connected to the bit line for detection of said transfer of the non-zero charge by the switching means.

8. In a non-volatile ferroelectric memory having a plurality of cells coupled in columns by bit lines and in rows by word lines, each of said cells comprising a capacitor having first and second plate electrodes, polarization of said capacitors corresponding to data stored therewithin; the improvement residing in a plate line distinct from said bit lines and said word lines coupled to the first of the plate electrodes of the capacitors, each of said cells further including switching means for coupling said second plate electrode of the capacitor to the corresponding one of the bit lines and means coupled to the switching means and delete "logically" for logically controlling the capacitor in each of the cells exclusively through the second plate electrodes thereof.

9. The memory of claim 8 further comprising a sense amplifier coupled to each of said bit lines.

10. A non-volatile ferroelectric memory comprising an array of memory cells arranged in rows and columns, each of said rows corresponding to a respective word line, each said columns corresponding to a respective bit line, a sense amplifier coupled to each of said bit lines; each of said memory cells comprising a capacitor having a first plate electrode that is logically inactive and a second plate electrode and transistor means for coupling said second plate electrode to the corresponding one of said bit lines; a corresponding one of said word lines being coupled to the transistor means; and a plate line coupled to the first plate electrode of each of said capacitors in said array distinct from said word lines and said bit lines to maintain the same logically inactive.

11. A non-volatile method of reading data from and restoring data to a memory cell selected from an array organized into rows and columns, each memory cell in the array including a ferroelectric capacitor having two plates and two polarization states established therebetween corresponding to two binary logic levels and a switchable device coupled to one of the plates of the capacitor, comprising the steps of:

applying a non-zero voltage across the plates of said capacitors in said cells;

applying a signal to a word line along the row corresponding to a selected memory cell for turning on the switchable device located therein thereby coupling said one of the plates of one of the capacitors to one of the bit lines corresponding to the column thereof;

evaluating the signal developed on the bit line corresponding to the selected memory cell to determine the logic states of the capacitor; and limiting logical control of the polarization states exclusively through said one of the two plates of the capacitor.

12. The method of claim 11 wherein said evaluating step includes operating a sense amplifier coupled to said bit line.

13. The method of claim 12 wherein said applied non-zero voltage is maintained constantly on the other of the plates of the capacitors.

14. The method of claim 11 wherein said applied non-zero voltage is maintained constant on the other of the plates of the capacitors.

15. In a non-volatile, self-restoring memory array comprising a plurality of cells selectively addressed through word lines to store binary logic data received during write operations and a plurality of bit lines to which voltage is applied during the write operations and through which the binary logic data is readout from the selectively addressed cells during read operations, a ferroelectric storage capacitor in each of the cells having opposed electrode plates and switching means operatively connected to a corresponding one of the word lines for electrically interconnecting one of the electrode plates to a corresponding one of the bit lines in response to selective address, the improvement residing in: means for maintaining a constant voltage on the other of the electrode plates of the capacitor in each of the cells during the write operations to effect said storing of the binary logic data in the storage capacitors thereof.

16. A non-volatile method of reading data from and restoring said data to ferroelectric capacitors in memory cells of an array organized into rows and columns by word lines and bit lines, respectively, each of the memory cells including a switchable device connected to the capacitor thereof which has two polarization states corresponding to binary logic of the data thereby established between opposed electrode plates, the steps of: applying signals to the word lines along the rows for turning on the switchable devices of selected ones of the memory cells thereby coupling one of the plates of the capacitors to the bit lines corresponding to the columns; applying a fixed non-zero voltage across the plates of the capacitors in a plurality of said memory cells along the rows through said one of the plates while said switchable devices in said cells are turned on; detecting the voltage levels on the bit lines corresponding to the selected memory cells to determine the logic of the data; and terminating the word line signals in time spaced relation to said determination of the logic of the data.

17. The method of claim 16 including the step of: transferring voltage from the bit lines to the other plates through the turned on switchable devices in order to establish the polarization states corresponding to the binary logic of the data.

18. In a cell of a memory array having word lines and bit lines, a capacitor with opposed electrodes and a switching device interconnected between one of the electrodes and a corresponding one of the bit lines under control of address signals transmitted through a corresponding one of the word lines controlling transfer of voltages to and from the capacitor, the improvement residing in:

ferroelectric means establishing a shunting resistance across the capacitor for enabling storage and readout of data with respect to the capacitor in response to said controlled transfer of voltage from and to the bit line under said control of the address signals and means for limiting said controlled transfer of voltage to said one of the electrodes of the capacitor.

19. A non-volatile ferroelectric memory comprising an array of memory cells arranged in rows and columns, each of said rows corresponding to a respective word line, each of said columns corresponding to a respective bit line, a respective sense amplifier being coupled to each of said bit lines;

each memory cell comprising a ferroelectric capacitor having first and second plate electrodes and a transistor located within said cell for coupling said first electrode of said ferroelectric capacitor to the corresponding bit line;

said word line being coupled to a control electrode of said transistor; and a plate line distinct from the word and bit lines coupled to the second plate electrode of said ferroelectric capacitor, said plate line being coupled to second plate electrodes of a plurality of capacitors in said array, and a source of constant voltage coupled to said plate line.

20. In a non-volatile electronic memory system having a source of constant voltage, a ferroelectric memory cell and means connected to the cell for retrieval and transfer of information, said ferroelectric cell including an electrically polarizable capacitor directly connected to the source of voltage, a data line and transistor switch means connected to the data line and the capacitor for controlling said retrieval and transfer of the information with respect to the data line.

* * * * *